United States Patent
Hanai

(10) Patent No.: US 6,773,533 B2
(45) Date of Patent: Aug. 10, 2004

(54) MANUFACTURING METHOD OF CERAMIC GREEN SHEET, MANUFACTURING METHOD OF MULTILAYER CERAMIC ELECTRONIC COMPONENTS, AND CARRIER SHEET FOR CERAMIC GREEN SHEETS

(75) Inventor: Hiroomi Hanai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/092,966

(22) Filed: Mar. 5, 2002

(65) Prior Publication Data

US 2002/0164469 A1 Nov. 7, 2002

(30) Foreign Application Priority Data

| Mar. 5, 2001 | (JP) | ........................................ 2001-059908 |
| Jun. 8, 2001 | (JP) | ........................................ 2001-174116 |
| Jun. 8, 2001 | (JP) | ........................................ 2001-174173 |

(51) Int. Cl.[7] ............................ B32B 7/06; B32B 7/12; B32B 27/16; B32B 31/28
(52) U.S. Cl. ........................ 156/230; 156/235; 156/240; 428/42.3; 428/352
(58) Field of Search ............................... 428/42.3, 352; 156/233, 235, 240

(56) References Cited

U.S. PATENT DOCUMENTS

| 5,438,165 | A | * | 8/1995 | Fritz ............................. 174/256 |
| 5,647,966 | A | * | 7/1997 | Uriu et al. ...................... 205/78 |
| 6,011,300 | A | * | 1/2000 | Muramatsu .................. 257/668 |
| 6,378,199 | B1 | * | 4/2002 | Yoshinuma et al. ........... 29/830 |
| 6,475,314 | B1 | * | 11/2002 | Yoshihiro et al. ........... 428/41.8 |
| 6,479,757 | B1 | * | 11/2002 | Tsukagoshi et al. ......... 174/259 |

FOREIGN PATENT DOCUMENTS

JP          6-61090       3/1994

* cited by examiner

Primary Examiner—John J. Zimmerman
Assistant Examiner—Jason Savage
(74) Attorney, Agent, or Firm—Knobbe Martens Oloson & Bear, LLP

(57) ABSTRACT

A manufacturing method of a ceramic green sheet comprising steps of; forming a predetermined electrode pattern on an adhesive layer separable by being heated or an adhesive layer separable by being cured with UV of a carrier sheet, wherein the carrier sheet comprising the separable adhesive layer on one side of a base film, and forming a ceramic green sheet with a ceramic slurry on the separable adhesive layer with the electrode pattern formed thereon. The electrodes in the ceramic green sheet obtained may be formed with good patterning accuracy and the carrier sheet may easily separated after formation of the ceramic green sheet.

21 Claims, 3 Drawing Sheets

MANUFACTURING METHOD OF CERAMIC GREEN SHEET, MANUFACTURING METHOD OF MULTILAYER CERAMIC ELECTRONIC COMPONENTS, AND CARRIER SHEET FOR CERAMIC GREEN SHEETS

BACKGROUND OF THE INVENTION

1. Field of the Invention

The present invention relates to a manufacturing method of a ceramic green sheet. Moreover, the present invention relates to a manufacturing method of a multilayer ceramic electronic component containing a manufacturing process of a laminated body of the above-described ceramic green sheet, and to a carrier sheet for ceramic green sheets used for the manufacturing method of the ceramic green sheet concerned. Furthermore, the present invention relates to a multilayer ceramic electronic component obtained by the manufacturing method of the above-described multilayer ceramic electronic component.

2. Description of the Prior Art

A multilayer ceramic electronic component as a multilayer ceramic capacitor or an inductor, they are manufactured in a method in which predetermined number of sheets of ceramic green sheets with internal electrodes prepared thereon are laminated, since electrodes are required inside. And baked with heat and furthermore external electrodes are applied to an edge part. Especially, in a multilayer ceramic capacitor, etc., a number of laminating of the above-described ceramic green sheets is required to be increased within a limited thickness, since a miniaturization and high performance are highly required. Therefore, in order to increase a number of lamination a thickness of the ceramic green sheet is made thinner.

As a laminating method of a ceramic green sheet, a method may be mentioned in which after electrode patterns used as internal electrodes are formed on a ceramic green sheet a predetermined number of sheets of the ceramic green sheet are laminated. However, since this method has a process in which electrodes are printed on a ceramic green sheet, a convex part is generated by thickness of electrodes formed and then the thickness is added up as a number of laminated layer is increased. As a result, possible shift between ceramic green sheets, etc. may be caused, and lamination with expected accuracy cannot be attained. Moreover, the ceramic green sheet, after laminated, is pressed under a high pressure in order to expect better integration. In this case, a difference between pressure in a portion in which electrodes exist and a portion in which electrodes do not exist may be generated to cause a high possibility of a separation, etc., of a decrease in yield and a possibility of a defect.

As a method to solve problems of the above-described laminating method of ceramic green sheet, a method is proposed in which operation is repeatedly performed that after formation of an electrode pattern used as internal electrodes on a carrier sheet, a ceramic green sheet is formed with a ceramic slurry, and subsequently obtained ceramic green sheet is laminated onto other ceramic green sheets (JP, 6-61090, A, etc.) . In a ceramic green sheet obtained by the method, since the electrodes are embedded inside, the green sheet does not have convex parts caused by electrodes and an ideal lamination and thin film formation may be realized. Moreover, the pressure non-uniformity generated in the press processing after lamination does not occur, and better integration is realized with better yield of a product and further a higher performance by highly multiple lamination may be expected.

In the laminating method of the above-described ceramic green sheet, since a ceramic green sheet is formed on a carrier sheet that is finally to be separated, the carrier sheet is required to have separable property that it may be separated easily from the obtained ceramic green sheet. Furthermore, in a carrier sheet, patterning accuracy must be secured so that a shift between electrodes may not occur when the electrode pattern used as internal electrodes are formed. However, any examples satisfying the above-described demand is not known in conventional carrier sheet for ceramic green sheets.

An object of the present invention is to provide a method for manufacturing a ceramic green sheet in which electrodes may be formed with good patterning accuracy and a carrier sheet may easily separated after formation of the ceramic green sheet. Namely, an object of the present invention is to provide a method for efficiently manufacturing a ceramic green sheet with high accuracy having internal electrodes embedded therein.

Moreover an object of the present invention is to provide a method of manufacturing a multilayer ceramic electronic component by laminating the ceramic green sheet manufactured by the manufacturing method of the above-described ceramic green sheet, and further to provide a multilayer ceramic electronic component manufactured by the manufacturing method concerned.

Moreover, an object of the present invention is to provide a carrier sheet for ceramic green sheets, used for a manufacturing method of the above-described ceramic green sheet and a manufacturing method of a multilayer ceramic electronic component.

SUMMARY OF THE INVENTION

As a result of wholehearted and repeated examination to solve the above-described subject, the present inventors found out that the above-described objection is attained by a method using the following carrier sheets for ceramic green sheets, and thus the present invention was completed.

The present invention relates to a manufacturing method of a ceramic green sheet comprising steps of;
 forming a predetermined electrode pattern on an adhesive layer separable by being heated or an adhesive layer separable by being cured with UV of a carrier sheet, wherein the carrier sheet comprising the separable adhesive layer on one side of a base film,
 and forming a ceramic green sheet with a ceramic slurry on the separable adhesive layer with the electrode pattern formed thereon.

In the above-described manufacturing method of a ceramic green sheet of the present invention, a carrier sheet is used having an adhesive layer separable by being heated or an adhesive layer separable by being cured with UV instead of a film in which treatment for separation is applied by silicone treatment, etc., in order to develop a separable property in a carrier sheet.

An adhesive layer separable by being heated of the above-described carrier sheet loses adhesion easily when heated, and develops a separable property. Thus, a ceramic green sheet and a carrier sheet are easily separable by being heated after the ceramic green sheet is formed or laminated. Moreover, an adhesive layer separable by being heated shows a certain level of adhesion, and thus wettability when applied is secured in a forming process of a ceramic green sheet in which the ceramic slurry is applied. Therefore, a green sheet in which an electrode pattern is formed with excellent patterning accuracy on a carrier sheet side may be manufactured, without deteriorating patterning accuracy of a location of a formed internal electrode pattern.

In the manufacturing method of the above-described ceramic green sheet, a method is preferable in which the adhesive layer separable by being heated of a carrier sheet foams when heated, and makes a separation with ease. When an adhesive layer separable by being heated foams with heat, the adhesion area between the carrier sheet and the ceramic green sheet is decreased, and then an adhesive strength is weakened, and as a result the carrier sheet and the ceramic green sheet maybe separated easily. As an adhesive layer separable by being heated in such a carrier sheet, for example, a type with a constitution in which thermal expandable fine-particles are contained in the adhesive layer may be suitably used.

Moreover, in the manufacturing method of the above-described ceramic green sheet, it is preferable that wherein a dynamic modulus of elastic of an adhesive forming the adhesive layer separable by being heated is in a range of $5 \times 10^3$ to $1 \times 10^6$ Pa at a temperature of 23 degrees C. to 150 degrees.

In order that internal electrodes may be formed with excellent patterning accuracy and moreover that it may be easily separated when heated after manufacture of a ceramic green sheet, an adhesive that forms the adhesive layer separable by being heated on the carrier sheet may preferably be a high elastic polymer having a dynamic modulus of elastic in the above-described range. When the above-described dynamic modulus of elastic is low, the thermal expandable fine-particles contained in an adhesive layer separable by being heated is flowing, and then the fine-particles cannot develop enough effect reducing adhesion area by foaming with heat to cause a tendency of difficulty in separation of the carrier sheet. Therefore, the above-described dynamic modulus of elastic is no less than $5 \times 10^3$ Pa, and preferably no less than $5 \times 10^4$ Pa. On the other hand, if the above-described dynamic modulus of elastic becomes high, there is a tendency for a fault of an electrode shift and for a patterning accuracy to be spoiled when ceramic slurry is applied after an electrodes are printed with electric conductive paste, etc. Moreover, when an electrode is formed by transferring method (removed and printed) of a metallic foil, if the above-described dynamic modulus of elastic is high, a poor transfer may occur, and as a result there is a tendency for an accurate electrode pattern no longer to be obtained. For this reason, the above-described dynamic modulus of elastic is preferably controlled no more than $1 \times 10^6$ Pa, and more preferably no more than $8 \times 10^5$ Pa. In addition, the above-described dynamic modulus of elastic is a value measured using dynamic viscoelasticity measurement equipment a Rheometrics ARES spectrometer (frequency of 1 Hz, 2 mm of sample thickness, 100 g of pressure loads).

Moreover, as an adhesive layer separable by being heated on the above-described carrier sheet, for example, a type containing a side chain crystalline resin in the adhesive layer is suitably used. A side chain crystalline resin represents a resin in which a side chain crystallizes at no less than a certain temperature.

In the manufacturing method of the above-described ceramic green sheet, an adhesive strength to stainless steel of the adhesive layer separable by being heated is preferably more than 0.1 N/20 mm at ordinary temperature (23 degrees C.), and is no more than 0.1 N/20 mm when heated. The adhesive layer separable enables adhesion to decrease when heated and also makes a separation easier. In order that a shift of printing may not occur when an electrode is formed on a carrier sheet, and that a poor transfer may not be obtained when electrodes are formed by transferring method (removed and printed) of a metallic foil, but in order to obtain an electrode pattern with excellent accuracy, the adhesive strength of an adhesive layer separable by being heated is preferably more than 0.1 N/20 mm at ordinary temperature (23 degrees C.), and preferably no less than 0.2 N/20 mm. Moreover, the adhesive strength of the adhesive layer when heated is preferably controlled to no more than 0.1 N/20 mm, and more preferably no more than 0.05 N/20 mm. Adhesive strength represents an adhesive strength to a stainless steel board (SUS 304BA) here according to a usual adhesive strength measuring method (JIS C 2107) (measuring conditions: a width of 20 mm, 2 kg of loads).

Now, the above-described adhesive layer separable by being cured with UV has a character to be cured with UV irradiation to form three-dimensional cross-links. This adhesive layer separable by being cured with UV loses adhesion easily with UV irradiation, and develops a separable property. When UV irradiation is applied after a ceramic green sheet is formed or laminated, the ceramic green sheet and the carrier sheet may be easily separated from each other. Moreover, an adhesive layer separable by being cured with UV shows a certain level of adhesion, and, thereby, the wettability in case of application is secured during a forming process of the ceramic green sheet in which a ceramic slurry is applied. Therefore, a green sheet in which an electrode pattern is formed in the carrier sheet side with an excellent patterning accuracy may be manufactured, without lowering the position accuracy of the internal electrode pattern to be formed.

In the manufacturing method of the above-described ceramic green sheet, an adhesive strength at ordinary temperature (23 degrees C.) to stainless steel of an adhesive layer separable by being cured with UV is preferably more than 0.1 N/20 mm before UV irradiation and no more than 0.1 N/20 mm after UV irradiation. An adhesive layer separable by being cured with UV represents an adhesive layer that loses adhesion with UV irradiation to enable an easy separation. In order that a shift of printing may not occur when an electrode is formed on a carrier sheet, and that a poor transfer may not be obtained when electrodes are formed by transferring method (removed and printed) of a metallic foil, but in order to obtain an electrode pattern with excellent accuracy, the adhesive strength of adhesive layer separable by being cured with UV is preferably more than 0.1 N/20 mm at ordinary temperature (23 degrees C.), and more preferably no less than 0.15 N/20 mm, and further preferably no less than 0.2 N/20 mm before UV irradiation. Moreover, the adhesive strength of the adhesive layer after UV irradiation is controlled to no more than 0.1 N/20 mm, and preferably no more than 0.05N/20 mm. Adhesive strength represents an adhesive strength to a stainless steel board (SUS 304BA) here according to a usual adhesive strength measuring method (JIS C 2107) (measuring conditions: a width of 20 mm, 2 kg of loads).

Moreover, the present invention relates to a manufacturing method of a multilayer ceramic electronic component comprising steps of;

laminating a ceramic green sheet onto other ceramic green sheets, after manufacturing the ceramic green sheet by the above-described method, and separating the carrier sheet from the ceramic green sheet by being heated or irradiated with UV.

The ceramic green sheet manufactured by the above-described manufacturing method may easily be released and separated from the carrier sheet by heating or UV irradiation, and moreover a high accuracy and precision are attained in a laminated body of the ceramic green sheet, without any shift of electrodes. Especially, an effect excellent is attained, in manufacturing of a highly multilayered ceramic capacitor in which a number of laminating exceeds 100 layers.

Moreover, the present invention relates to a carrier sheet for a ceramic green sheets used for the manufacturing method of the above-described ceramic green sheet or for the manufacturing method of the above-described multilayer ceramic electronic component, comprising an adhesive layer separable by being heated or an adhesive layer separable by being cured with ultraviolet on one side of a base film.

Using such a carrier sheet for ceramic green sheets, internal electrodes with a good patterning accuracy maybe formed, and moreover the carrier sheet may easily be separated from the ceramic green sheet, and thus a ceramic green sheet, a laminated body thereof, and further a multilayer ceramic electronic component may efficiently be manufactured.

Furthermore, the present invention relates to a multilayer ceramic electronic component obtained by the manufacturing method of the above-described multilayer ceramic electronic component.

DETAILED DESCRIPTION OF THE PREFERRED EMBODIMENTS

Figure 1:
FIG. 1 shows a sectional view of a carrier sheet for ceramic green sheets.

Details about embodiments of the present invention will be illustrated below, referring to drawings. FIG. 1 shows a carrier sheet 1 for ceramic green sheets having a separable adhesive layer 1*b* on one side of a base film 1*a*. The separable adhesive layer 1*b* is an adhesive layer separable by being heated or an adhesive layer separable by being cured with UV.

Various plastic films may be used without any limitation as base film 1*a* that is a substrate of the carrier sheet 1, generally polyester film is preferable. As other plastic films, films with heat resistance, such as polyimide film, polymethylpentene, polyethylenenaphthalate, and polybutylenenaphthalate may preferably be used, for example. Moreover, as base film 1*a*, other than plastic films, paper substrates, metallic foils, and these composite films are may also be used. A thickness of the base film 1*a* is usually about 10 to 200 micrometers. In addition, when the separable adhesive layer 1*b* is an adhesive layer separable by being cured with UV, since UV irradiation is applied, an optically transparent film is used as the base film 1*a* that is the substrate of the carrier sheet 1.

As formation material of the separable adhesive layer 1*b*, an adhesive containing a base polymer having some level of adhesion is usually used so that the electrode pattern formed may be fixed.

As the above-described base polymers, for example, natural rubbers, synthetic rubbers, acrylics derived polymers, etc. may be mentioned. In addition, as acrylics derived polymers, polymers obtained by copolymerising alkyl acrylates and/or alkyl methacrylates (alkyl group with 1 to 20 carbons , such as methyl group, ethyl group, propyl group, butyl group, 2-ethyl hexyl group, iso-octyl group, iso-nonyl group, iso-decyl group, dodecyl group, lauryl group, tridecyl group, pentadecyl group, hexadecyl group, heptadecyl group, octadecyl group, nonadecyl group, eicosyl group may be mentioned) as main components with comonomer, such as acrylic acid, methacrylic acid, itaconic acid, hydroxypropyl acrylate, hydroxypropyl methacrylate, N-methylol acryliamide, acrylonitrile, methacrylonitrile, glycidyl acrylare, glycidyl methacrylate , vinyl acetate, styrene, isoprene, butadiene, isoprene, vinyl ether, may be mentioned. When the separable adhesive layer 1*b* is an adhesive layer separable by being cured with UV, the above-described base polymer may be polymers that has photopolymerizable carbon-carbon double bond therein.

Moreover, in addition to the base polymer, a cross-linking agent may also be suitably added to the above-described adhesives. As examples of cross-linking agents, such as polyisocyanate compounds, epoxy compounds, aziridine compounds, melamine derived compounds, metal salt derived compounds, metal chelate derived compounds, amino resin derived compounds, and vulcanizing agents, such as peroxides, may be mentioned.

By selecting the types of cross-linking agents and adjusting the amount etc. according to kinds of separable adhesive layer 1*b*, the adhesive strength before heating and after heating or the adhesive strength before UV irradiation and after UV irradiation may be controlled so that they are in the above-described range. Usually, it is preferable to use a cross-linking agent 0.1 to 10 weight parts, and more preferable to use 1 to 5 weight parts to a base polymer 100 weight parts.

Furthermore, additives usually used, such as various kinds of conventionally well-known tackifiers, antioxidants, fillers, and coloring agents may be added by necessity to the adhesive forming the adhesive layer.

Thermal expandable fine-particles may be added in the adhesives, in order to provide a separable property when heated in the case where an adhesive layer separable by being heated is adopted as the above-described separable adhesive layer 1*b*.

An average diameter of thermal expandable fine-particles is preferably about 1 to 25 micrometers. If the average diameter of particles is small, a decrease of an adhesion area required for a separable property by being heated may not be demonstrated enough. Moreover, use of particles having an excessive large average diameter declines surface flatness and smoothness of the green sheet 2 that is formed with ceramic slurry applied, etc., to induce a possible defects. An average diameter of particles is more preferably about 5 to 15 micrometers, and especially preferably about 10-micrometers. As a thermal expandable fine-particles, materials that are expandable with heat maybe used it without any special limitation, and suitable thermal expandable microcapsules currently encapsulated by an in-situ polymerization, etc. using shell sheath of copolymer, such as vinylidene chloride and acrylonitrile and proper gas foaming components with low boiling point, such as butane, propane, and pentane. Thermal expandable microcapsules also have an advantage, such as excellent dispersibility and mixing property with the above-described adhesives. As thermal expandable microcapsules marketed, for example, Microsphere (brand name: manufactured by Matsumoto Yushi-Seiyaku Co., Ltd), etc. may be mentioned.

A content of the thermal expandable fine-particles (thermal expandable microcapsules) in the above-described adhesive may be suitably determined according to the kind of the above-described adhesives as a quantity having adhesive strength decline to a level in which the above-described carrier sheet 1 is easily separated. In general, an amount is about 1 to 100 weight parts, preferably 5 to 50 weight parts, and more preferably 10 to 40 weight parts to a base polymer 100 weight parts.

A thickness of the adhesive layer separable by being heated (after applied and dried) containing thermal expandable fine-particles is not especially limited, it is usually about 5 to 150 micrometers, and preferably about 20 to 80 micrometers.

When an adhesive layer separable by being heated is adopted as the above-described separable adhesive layer 1b, for example, a side chain crystalline resin may be blended as an adhesive in order that a separable property when heated might be developed.

As side chain crystalline resins, for example, may be mentioned as a principal component: alkyl acrylates and/or alkyl methacrylates (as alkyl groups having no less than 16 carbons and preferably 16 to 20 carbons, and as examples of this type, hexadecyl group, heptadecyl, octadecyl group, nonadecyl group, eicosyl group, etc.). Compounds that may also be introduced into acrylics derived polymers as copolymerization components may be introduced to the above-described compounds, and as examples: acrylic acid, methacrylic acid, itaconic acid, hydroxypropyl acrylate, hydroxypropyl methacrylate, N-methylol acryliamide, acrylonitrile, methacrylonitrile, glycidyl acrylate, glycidyl methacrylate, vinyl acetate, styrene, isoprene, butadiene, isoprene, vinyl ether, etc. may be mentioned.

A content of the side chain crystalline resin to the above-described adhesives may suitably be determined according to the kind of the above-described adhesives to satisfy a condition that an adhesive layer separable by being heated shows adhesion in the adhesives at ordinary temperature and crystallization of the side chain crystalline resin advances by heating to lose adhesion so that the adhesive strength might be decreased to a level in which the above-described carrier sheet 1 may easily be separated. In general, a solid part weight ratio of (adhesive): (side chain crystalline resin) is about 95:5 to 70:30, and preferably about 90:10 to 80:20.

The thickness (after applied and dried) of the adhesive layer separable by being heated in which a side chain crystalline resin contained is not especially limited, it is usually about 5 to 150 micrometers, and preferably about 20 to 80 micrometers.

In the above-described adhesive layer separable by being heated, side chain crystalline resins and thermal expandable fine-particles may be used together in order to increase separable property.

When an adhesive layer separable by being cured with UV is adopted as the above-described separable adhesive layer 1b, a low molecular compound with at least two photopolymerizable carbon-carbon double bond in a molecule (henceforth referred to as a photopolymerizable compound) demonstrating a separable property when cured with UV and a photopolymerization initiator are blended into the adhesives in order that separable property when heated might be demonstrated.

A molecular weight of the photopolymerizable compounds is usually about no more than 10000, and more preferably no more than 5000 so that cross-linked network of the adhesive layer separable by being cured with UV may be formed efficiently with UV irradiation. The number of photo polymerizable carbon-carbon double bond in the molecule is preferably about two to six. As especially preferable photopolymerizable compounds, for example, trimethylolpropane triacrylate, tetramethylolmethane tetraacrylate, pentaerythritol monohydroxy triacrylate, pentaerythritol tetraacrylate, dipentaerythritol monohydroxy pentaacrylate, dipentaerythritol hexaacrylate, etc. may be mentioned. One kind of photopolymerizable compound maybe used independently and a combination of two or more kinds may also be used.

An amount of the photopolymerizable compound used is usually in a range of about 1 to 100 weight parts based on the above-described base polymer 100 weight parts, and preferably in a range of 5 to 50 weight parts. When insufficient amount of the photopolymerizable compounds is used, cross-linked network of the adhesive layer separable by being cured with UV maybe formed insufficiently with UV irradiation, then a decrease in an adhesive strength is small to cause a difficulty in separation from the carrier sheet 1. On the other hand, if excessive amount is used, problems, such as remaining of the photopolymerization initiator may possibly be caused.

As examples of photopolymerization initiator, isopropylbenzoin ether, isobutylbenzoin ether, benzophenone, chloro thioxanthone, dodecyl thioxanthone, dimethyl thioxanthone, diethyl thioxanthone, acetophenone diethyl ketal, benzyl dimethyl ketal, α-hydroxy cyclohexyl phenylketone, 2-hydroxymethyl phenyl propane, etc. may be mentioned. One kind of photopolymerization initiator may be used independently and a combination of two or more kinds may also be used.

An amount of the photopolymerization initiator used is usually in a range of about 0.1 to 5 weight parts based on the above-described base polymer 100 weight parts, and preferably in a range of 0.5 to 2 weight parts. When insufficient amount of the photopolymerization initiator is used, cross-linked network may be formed insufficiently with UV irradiation, a difficulty in separation from the carrier sheet 1 maybe caused. On the other hand, if excessive amount is used, problems caused by remaining of the photopolymerization initiator may possibly be caused. In addition, amine compounds, such as triethyl amine and tetraethylpentaamine dimethylaminoethanol, may be used together as a photopolymerization accelerator if needed.

A thickness (after applied and dried) of an adhesive layer separable by being cured with UV is not especially limited, it is usually about 1 to 150 micrometers, and preferably about 5 to 15 micrometers.

A side chain crystalline resin and thermal expandable fine-particles may also be blended to the adhesive layer separable by being cured with UV in order to increase a separable property.

In a carrier sheet 1 of the present invention, a separable adhesive layer 1b (an adhesive layer separable by being heated or an adhesive layer separable by being cured with UV) with a certain level of adhesion is formed on a base film 1a. A preparation method is not especially limited; a method may be adopted preferably. For example, a method in which the above-described adhesive is directly applied on to a base film 1a to form a separable adhesive layer 1b thereon; a method in which after the above-described adhesive is applied and a separable adhesive layer 1b is formed on the easily separable separator that is a film given a treatment for separation, then this film is transferred on the base film 1a.

Figure 2:
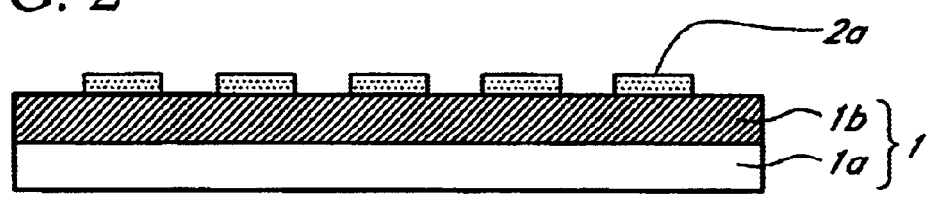
FIG. 2 shows a sectional view of an internal electrode formed on a carrier sheet for ceramic green sheets.
Figure 3:
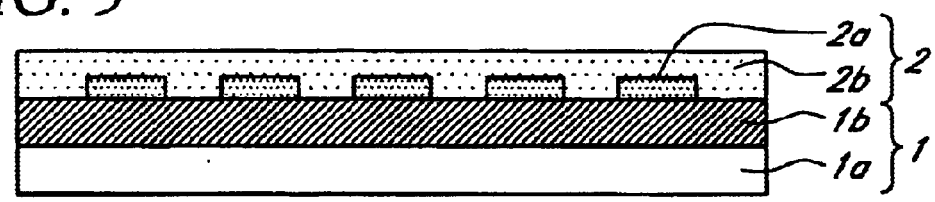
FIG. 3 shows a sectional view of a ceramic green sheet formed on a carrier sheet for ceramic green sheets.

As a manufacturing method of a ceramic green sheet 2 of the present invention, a following method is adopted: first as is shown in FIG. 2, after predetermined electrode pattern 2a is formed on a separable adhesive layer 1b formed on the above-described carrier sheet 1, a ceramic slurry is applied to cover an electrode pattern 2a, as shown in FIG. 3, onto a separable adhesive layer 1b top in which the electrode pattern 2a concerned is formed, and then dried to form a ceramic binder layer 2b.

Especially a formation method of the electrode pattern 2a is not limited, and, for example, a method may be mentioned by which electric conductive paste forming internal electrodes is printed. As electric conductive pastes, an electric conductive paste mainly made of palladium alloy or nickel may be mentioned, and a screen printing method, etc. may be mentioned as printing method. A thickness of the electrode pattern 2a is preferably as thin as possible. A thickness after dried is desirably to be controlled to 1 to 1.5 micrometers. Moreover, as a formation method of the electrode pattern 2a, a method may be adopted by which a patternized foil metal is transferred using adhesion of the separable adhesive layer 1b of the carrier sheet 1. In order to obtain still thinner electrode pattern 2a, a pattern plating method or a pattern evaporation coating method may be used.

As a ceramic slurry forming the ceramic binder layer 2b, a slurry having a viscosity adjusted with solvents for dilution and containing ceramic raw material powder, such as barium titanate and calcium titanate, and organic binder may be used. As an application method of ceramic slurry, general sheet forming methods, for example, a doctor blade method and a reverse coating method, etc. may be adopted. A thickness of the ceramic green sheet 2 after dried is preferably about 2 to 5 micrometers, and application is uniformly performed so that the thickness after dried may be in the above-described range.

In addition, when the separable adhesive layer 1b is an adhesive layer separable by being heated containing a thermal expandable fine-particles, the drying temperature of a ceramic slurry is preferably a temperature at which the thermal expandable fine-particles in an adhesive layer separable by being heated does not expand with the heat at the time of drying, and a solvent is preferably dried at a temperature. The drying temperature is usually preferably no more than 80 degrees C.

When the separable adhesive layer 1b is an adhesive layer separable by being heated in which a side chain crystalline resin is contained, the drying temperature of the ceramic slurry is about 100 degrees C. In this case, although heat acts on the carrier sheet 1 and the adhesion of the adhesive layer separable by being heated is once lost, if a method is adopted by which the ceramic slurry is applied onto a separator with a treatment for separation and without adhesion and subsequently dried, any problems on production do not occur. The temperature of the ceramic green sheet 2 is again adjusted to a temperature of no more than a predetermined temperature. The adhesive layer separable by being heated demonstrates adhesion again.

When the separable adhesive layer 1b is an adhesive layer separable by being cured with UV, a solvent is preferably dried at a temperature of no more than about 100 degrees C. so that heat given in drying temperature of a ceramic slurry does not cure the adhesive layer separable by being cured with UV in the carrier sheet 1.

In this way, the ceramic green sheet 2 with both sides flat and smooth on which a metal pattern 2a forming internal electrodes with a predetermined pattern on the separable adhesive layer 1b of the carrier sheet 1 may be formed as shown in FIG. 3. Since the ceramic green sheet 2 is separated together with the electrode 2a from the carrier sheet 1, any convex parts by the electrode 2a are not formed. Highly multiple laminating is realized by a press processing at low pressure and super position may be easily carried out without being influenced by a thickness by lamination, since the ceramic green sheet 2 has a predetermined thickness and a laminating between flat and smooth faces is formed.

As shown in FIG. 4(a), FIG. 4(b) or FIG. 5(a) to FIG. 5(c), the ceramic green sheet 2 formed on the carrier sheet 1 shown in FIG. 3 is laminated onto other ceramic green sheets, and a ceramic green sheet laminated body is formed. Then, the carrier sheet 1 is separated from the ceramic green sheet 2 after heat-treatment or UV irradiation processing. Convenient equipments may used for heating or UV irradiation.

Figure 4A:
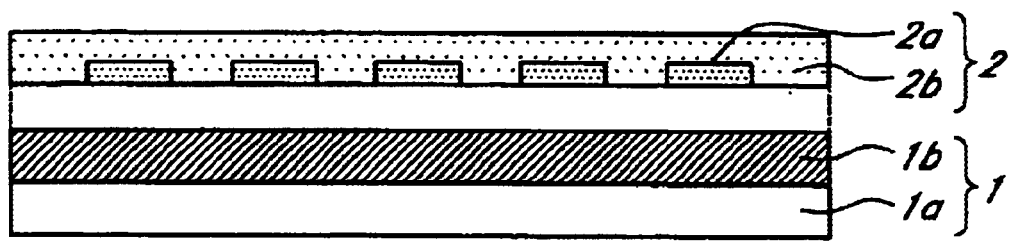
FIG. 4(*a*) and FIG. 4(*b*) show a sectional view of the ceramic green sheet laminated body in which a ceramic green sheet and a carrier sheet are manufactured separately.
Figure 4B:
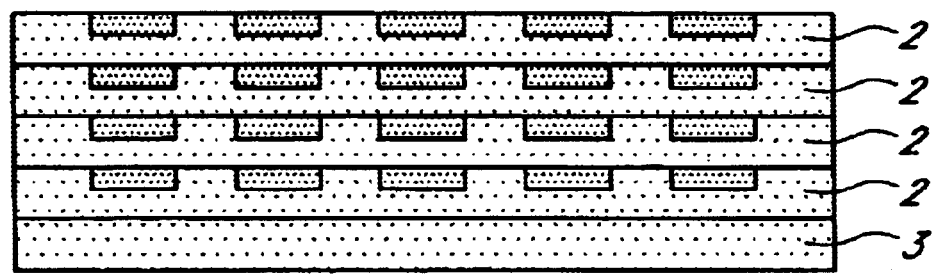

For example, as shown in FIG. 4(a), a method may be mentioned in which after the carrier sheet 1 and the ceramic green sheet 2 are separated by heat-treatment or UV irradiation processing, only the ceramic green sheets 2 are combined together and then the ceramic green sheets 2 are laminated one by one as shown in FIG. 4(b). In FIG. 4(b), on the ceramic green sheet 3 used as a substrate, one ceramic green sheet 2 is laminated first, and then next ceramic green sheets 2 are laminated one by one.

Although a heating temperature at the time of releasing and separating of the carrier sheet 1 is not especially limited, it is usually about 90 to 150 degrees C. Although an amount of UV irradiation at the time of releasing and separating of the carrier sheet 1 is not especially limited, it is usually about 50 to 1000 mJ/cm$^2$.

Figure 5A:
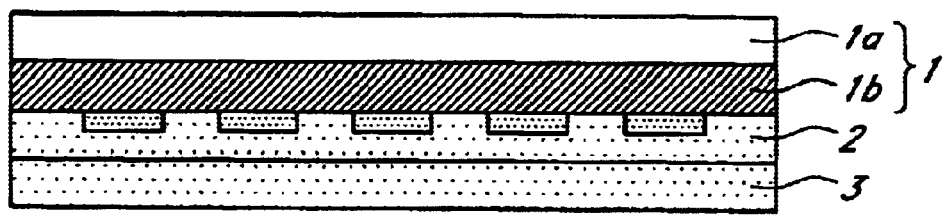
FIG. 5(*a*) to FIG. 5(*c*) show a sectional view of the ceramic green sheet laminated body in which a ceramic green sheet and a carrier sheet are manufactured separately.
Figure 5B:
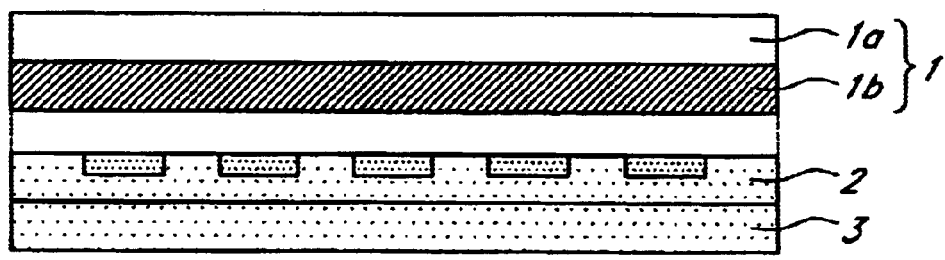
Figure 5C:
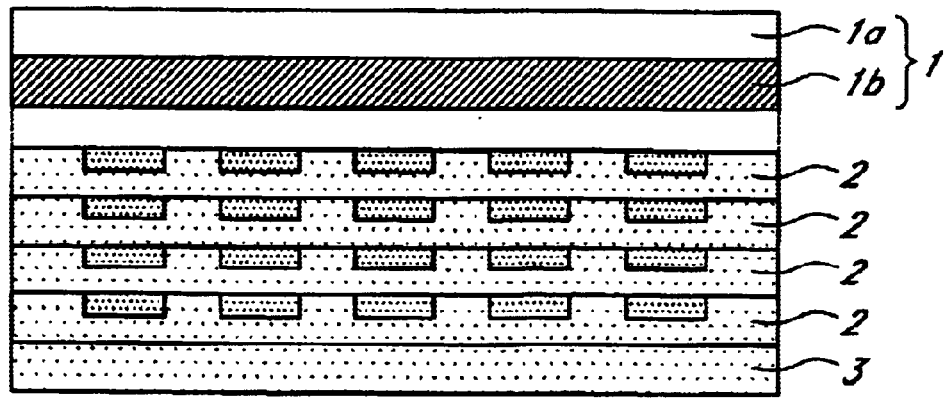

Moreover, a method may be mentioned in which the ceramic green sheet 2 is piled up on the ceramic green sheet 3 as a substrate and subsequently the laminated body is adhered by pressure and heat (further irradiated with UV), and thereby the carrier sheet 1 is separated while the ceramic green sheet 2 is transferred and laminated, as shown in FIG. 5(b) and FIG. 5(c). Then, this operation is repeated successively; electrode patterns are located with sufficient accuracy, further repeatedly adhered by pressure and heat, and thus the ceramic green sheets 2 are laminated. Although conditions of adhering by pressure and heat are not especially limited, conditions of about 20 to 50 degrees C. and $1\times10^5$ to $1\times10^8$ Pa are usually adopted.

When the above-described ceramic green sheet 2 is laminated, an accuracy of superposition at the time of laminating is also controllable in a way that laminating and separating of the carrier sheet 1 are performed in sequence after the ceramic green sheet 2 is punched off beforehand with sufficient accuracy from the carrier sheet 1.

The above-described ceramic green sheet laminated body is treated in a process in which laminated body is cut and chipped, and a process in which chips are baked, and further a process in which external electrodes are formed to the chips, and thus electronic parts, such as a multilayer ceramic capacitor, are manufactured.

EXAMPLES

The present invention is to be illustrated using Examples below, the present invention is not limited at all by these Examples. In addition, parts and % in each example represent weight parts and % respectively.

Example 1

An isocyanate derived cross-linking agent 5 parts was added to a polymer 100 parts (converted from a solid content 40% of toluene solution) that comprises a copolymer obtained by copolymerizing ethyl acrylate 50 parts, butyl acrylate 50 parts, and 2-hydroxyethyl acrylate 1 part, and elastomer (solution) whose dynamic modulus of elastic after cross-linking was adjusted to $5 \times 10^5$ Pa was prepared. Thermal expandable fine-particles (manufactured by Matsumoto Yushi-Seiyaku Co., Ltd,, Matsumoto Microsphere F-50D) 30 parts having 15 micrometers of average diameter of particles was dispersed and blended to the above-described elastomer (solid) 100 parts, and thus an adhesive separable by being heated was prepared. The adhesive separable by being heated was applied on a polyester film with a thickness of 50 micrometers and then dried, and a carrier sheet having an adhesive layer separable by being heated with a thickness of 50 micrometer was produced.

Comparative Example 1

In Example 1, a carrier sheet was produced, as in Example 1 except a thermal expandable fine-particles was not added into the adhesive. Measurement of Adhesive Strength An adhesive strength (N/20 mm) at ordinary temperature (23 degrees C.) and the adhesive strength (N/20 mm) after heated of the carrier sheets obtained by the Example or the Comparative example after heated were investigated. The adhesive strength represents an adhesive strength to a stainless steel board (SUS 304BA). The adhesive strength after heating represents an adhesive strength after the carrier sheet was adhered onto the stainless steel board and heated for 3 minutes in 130-degree C. heating furnace. Results are shown in Table 1.

TABLE 1

|  | Example 1 | Comparative example 1 |
| --- | --- | --- |
| Adhesive strength at ordinary temperature (N/20 mm) | 2 | 3.5 |
| Adhesive strength after heated (N/20 mm) | 0 | 3.8 |

Measurement conditions: width 20 mm, load 2 kg

Example 2

An isocyanate derived cross-linking agent (Collonate L manufactured by NIPPON POLYURETHANE INDUSTRY CO., LTD.) 5 parts was added to a polymer 100 parts (converted from a solid content 40% of toluene solution) that comprises a copolymer obtained by copolymerizing ethyl acrylate 50 parts, butyl acrylate 50 parts, and 2-hydroxyethyl acrylate 1 part, and an adhesive (solution) was prepared. A polymer (converted from a solid content 30% of toluene solution) 20 parts that is obtained by copolymerizing acrylic acid 5 parts and octadecyl acrylate 100 parts was added to the above-described adhesive (solid) 100 parts, and an adhesive separable by being heated was prepared. The adhesive separable by being heated was applied using an applicator on a polyester film (25 micrometers) so that a thickness of the adhesive layer after dried is 5 micrometers, and then dried for 3 minutes by the hot-air dryer at 130 degrees C. to obtain a desired carrier sheet.

Comparative Example 2

An isocyanate derived cross-linking agent (Collonate L manufactured by NIPPON POLYURETHANE INDUSTRY CO., LTD.) 8 parts was added to a polymer 100 parts (converted from a solid content 40% of toluene solution) that comprises a copolymer obtained by copolymerizing ethyl acrylate 50 parts, butyl acrylate 50 parts, and 2-hydroxyethyl acrylate 1 part, and an adhesive (solution) was prepared. The adhesive was applied using an applicator on a polyester film (25 micrometers) so that a thickness of the adhesive layer after dried is 5 micrometers, and then dried for 3 minutes by the hot-air dryer at 130 degrees C. to obtain a desired carrier sheet.

Comparative Example 3

An isocyanate derived cross-linking agent (Collonate L manufactured by NIPPON POLYURETHANE INDUSTRY CO., LTD.) 5 parts was added to a polymer 100 parts (converted from a solid content 40% of toluene solution) that comprises a copolymer obtained by copolymerizing ethyl acrylate 50 parts, butyl acrylate 50 parts, and 2-hydroxyethyl acrylate 5 parts, and an adhesive (solution) was prepared. The adhesive was applied using an applicator on a polyester film (25 micrometers) so that a thickness of the adhesive layer after dried is 5 micrometers, and then dried for 3 minutes by the hot-air dryer at 130 degrees C. to obtain a desired carrier sheet. Measurement of Adhesive Strength An adhesive strength (N/20 mm) at ordinary temperature (23 degrees C.) and the adhesive strength (N/20 mm) after heated of the carrier sheets obtained by the Examples or the Comparative examples after heated were investigated. The adhesive strength represents an adhesive strength to a stainless steel board (SUS 304BA). The adhesive strength after heated represents an adhesive strength at measurement temperature of 100 degrees C., after the carrier sheet was adhered onto a stainless steel board. Results are shown in

TABLE 2

|  | Example 2 | Comparative example 2 | Comparative example 3 |
| --- | --- | --- | --- |
| Adhesive strength at ordinary temperature (N/20 mm) | 2 | 0.3 | 5 |
| Adhesive strength after heated (N/20 mm) | 0 | 0.2 | 4 |

Measurement conditions: width 20 mm, load 2 kg

Example 3

An isocyanate derived cross-linking agent (Collonate L manufactured by NIPPON POLYURETHANE INDUSTRY CO., LTD.) 6 parts, and dipentaerythritol monohydroxy pentaacrylate 15 parts and alpha-hydroxy cyclohexyl phenylketone 1 part were added into a polymer 100 parts (converted from a solid content 40% of toluene solution) that comprises a copolymer obtained by copolymerizing butyl acrylate 100 parts, acrylonitrile 5 parts, and acrylic acid 5 parts and mixed to prepare an adhesive separable by being cured with UV. The adhesive was applied using an applicator on a polyester film (50 micrometers) so that a thickness of the adhesive layer after dried is 10 micrometers, and then dried for 3 minutes by the hot-air dryer at 130 degrees C. to obtain a desired carrier sheet.

Example 4

An isocyanate derived cross-linking agent (Collonate L manufactured by NIPPON POLYURETHANE INDUSTRY CO., LTD.) 10 parts, and dipentaerythritol monohydroxy pentaacrylate 15 parts and alpha-hydroxy cyclohexyl phenylketone 1 part were added into a polymer 100 parts (converted from a solid content 40% of toluene solution) that comprises a copolymer obtained by copolymerizing butyl acrylate 100 parts, acrylonitrile 5 parts, and acrylic acid 5 parts and mixed to prepare an adhesive separable by being cured with UV. The adhesive was applied using an applicator on a polyester film (50 micrometers) so that a thickness of the adhesive layer after dried is 10 micrometers, and then dried for 3 minutes by the hot-air dryer at 130 degrees C. to obtain a desired carrier sheet.

Example 5

An isocyanate derived cross-linking agent (Collonate L manufactured by NIPPON POLYURETHANE INDUSTRY CO., LTD.) 8 parts, and dipentaerythritol monohydroxy pentaacrylate 15 parts and alpha-hydroxy cyclohexyl phenylketone 1 part were added into a polymer 100parts (converted from a solid content 40% of toluene solution) that comprises a copolymer obtained by copolymerizing butyl acrylate 100 parts, acrylonitrile 5 parts, and acrylic acid 5 parts and mixed to prepare an adhesive separable by being cured with UV. The adhesive was applied using an applicator on a polyester film (50 micrometers) so that a thickness of the adhesive layer after dried is 10 micrometers, and then dried for 3 minutes by the hot-air dryer at 130 degrees C. to obtain a desired carrier sheet.

Comparative Example 4

An isocyanate derived cross-linking agent (Collonate L manufactured by NIPPON POLYURETHANE INDUSTRY CO., LTD.) 15 parts was added to a polymer 100 parts (converted from a solid content 40% of toluene solution) that comprises a copolymer obtained by copolymerizing butyl acrylate 100 parts, acrylonitrile 5 parts, and acrylic acid 5 parts, and mixed to prepare an adhesive. The adhesive was applied using an applicator on a polyester film (50 micrometers) so that a thickness of the adhesive layer after dried is 10 micrometers, and then dried for 3 minutes by the hot-air dryer at 130 degrees C. to obtain a desired carrier sheet.

Comparative Example 5

An isocyanate derived cross-linking agent (Collonate L manufactured by NIPPON POLYURETHANE INDUSTRY CO., LTD.) 1 part was added to a polymer 100 parts (converted from a solid content 40% of toluene solution) that comprises a copolymer obtained by copolymerizing butyl acrylate 100 parts, acrylonitrile 5 parts, and acrylic acid 5 parts, and mixed to prepare an adhesive. The adhesive was applied using an applicator on a polyester film (50 micrometers) so that a thickness of the adhesive layer after dried is 10 micrometers, and then dried for 3 minutes by the hot-air dryer at 130 degrees C. to obtain a desired carrier sheet.

Measurement of Adhesive Strength

The adhesive strength (N/20 mm) before UV irradiation and the adhesive strength (N/20 mm) after UV irradiation at ordinary temperature (23 degrees C.) of the carrier sheet obtained by the Examples or the Comparative examples were investigated. An adhesive strength represents the adhesive strength to a stainless steel board (SUS 304BA). The adhesive strength after UV irradiation represents an adhesive strength after the carrier sheet was stuck on the stainless steel board and then UV irradiation was carried out for 20 seconds from 15 cm distance using a high pressure mercury lamp (40 W/cm). Results are shown in Table 3.

TABLE 3

|  | Example 3 | Example 4 | Example 5 | Comparative example 4 | Comparative example 5 |
|---|---|---|---|---|---|
| Adhesive strength before irradiation (N/20 mm) | 2.0 | 0.5 | 1.0 | 0.5 | 5.0 |
| Adhesive strength after irradiation (N/20 mm) | 0.1 | 0 | 0.05 | 0.5 | 5.0 |

Measurement conditions: width 20 mm, load 2 kg

Example 1, and Comparative Example 1

Manufacturing of a Ceramic Green Sheet and a Laminated Body Thereof

On the carrier sheet obtained by the Example or the Comparative example, using a screen printing method, an electric conductive paste was applied in a shape of a predetermined pattern, and was heated and dried at a temperature (70 degrees C.) at which the thermal expandable fine-particles in an adhesive layer separable by being heated does not expand. A ceramic slurry comprising barium titanate and acrylics derived resin used as a binder was applied onto the obtained carrier sheet using an applicator, and dried, and a ceramic green sheet with a thickness of 3 micrometers was manufactured. The ceramic green sheet obtained was adhered with a hand roller to a ceramic green sheet (30 micrometers in thickness) as substrate separately formed using the above-described ceramic slurry (barium titanate and acrylics derived resin as a binder). Subsequently, while the obtained sheet was adhered by pressure at a pressure of $5 \times 10^5$ Pa, for 20 seconds, at 130 degrees C. using a heat sealing machine (heat pressing machine) to complete laminating of the ceramic green sheet, the carrier sheet that separated by foaming with heat was removed. Furthermore, the same method was repeated and 10-layer of laminating of the ceramic green sheet was carried out. The following evaluations were performed about the ceramic green sheet laminated body obtained. Results are shown in Table 4.

Electrode Shift

The obtained laminated body of the ceramic green sheet was cut, and it was confirmed whether any shift occurred in a size of internal electrodes pattern.

Laminating Property: Separable Property

When laminating the ceramic green sheets, it was evaluated whether a separation of the carrier sheet was performed without any fault.

TABLE 4

|  | Example 1 | Comparative example 1 |
|---|---|---|
| Electrode shift | No shift | No shift |
| Laminating property | Good | Difficult in lamination |

Example 2, and Comparative Examples 2 and 3
Manufacturing of a Ceramic Green Sheet and a Laminated Body Thereof On the carrier sheet obtained by the Example or the Comparative examples, using a screen printing method, an electric conductive paste was applied in a shape of a predetermined pattern, and was heated and dried at 90 degrees C. A ceramic slurry comprising barium titanate and acrylics derived resin used as a binder was applied onto the obtained carrier sheet using an applicator, and dried at 70 degrees C., and a ceramic green sheet with a thickness of 3 micrometers was manufactured. The ceramic green sheet obtained was adhered with a hand roller to a ceramic green sheet (30 micrometers in thickness) as substrate separately formed using the above-described ceramic slurry (barium titanate and acrylics derived resin as a binder). Subsequently, while the obtained sheet was adhered by pressure at a pressure of 5×10$^5$ Pa, for 20 seconds, at 130 degrees C. using a heat sealing machine (heat pressing machine) to complete laminating of the ceramic green sheet, and then the carrier sheet while heated was removed. Furthermore, the same method was repeated and 10-layer of laminating of the ceramic green sheet was carried out. The same evaluations of electrode shift, laminating property: separable property as described above for the ceramic green sheet laminated body were performed. Results are shown in Table 5.

TABLE 5

|  | Example 2 | Comparative example 2 | Comparative example 2 |
|---|---|---|---|
| Electrode shift | No shift | Unable to be examined | Unable to be examined |
| Laminating property | Good | Difficult in lamination | Difficult in lamination |

In the Comparative examples, the ceramic green sheet could not be separated from the carrier sheet, and therefore electrode shift was not examined.

Examples 3 to 5 and Comparative Examples 4 and 5

Manufacturing of a Ceramic Green Sheet and a Laminated Body Thereof

On the carrier sheet obtained by the Examples or the Comparative examples, using a screen printing method, an electric conductive paste was applied in a shape of a predetermined pattern, and was heated and dried at 90 degrees C. for one minute. A ceramic slurry comprising barium titanate and acrylics derived resin used as a binder was applied onto the obtained carrier sheet using an applicator, and dried at 70 degrees C., and a ceramic green sheet with a thickness of 3 micrometers was manufactured. The ceramic green sheet obtained was adhered with a hand roller to a ceramic green sheet (30 micrometers in thickness) as substrate separately formed using the above-described ceramic slurry (barium titanate and acrylics derived resin as a binder) Further more adhered with laminator the ceramic green sheets were laminated. Then UV irradiation was carried out for 20 seconds from 15 cm distance using a high pressure mercury lamp (40 W/cm) to the obtained laminated body, and subsequently the carrier sheet was removed. Furthermore, the same method was repeated and 10-layer of laminating of the ceramic green sheet was carried out. The same evaluations of electrode shift, laminating property: separable property as described above for the ceramic green sheet laminated body were performed. Results are shown in Table 6.

TABLE 6

|  | Example 3 | Example 4 | Example 5 | Comparative example 4 | Comparative example 5 |
|---|---|---|---|---|---|
| Electrode shift | No shift | No shift | No shift | Unable to be examined | Unable to be examined |
| Laminating property | Good | Good | Good | Difficult in lamination | Difficult in lamination |

In the Comparative examples, the ceramic green sheet was not able to be separated from the carrier sheet, and therefore electrode shift was not examined.

What is claimed is:

1. A method for manufacturing a ceramic green sheet comprising steps of:
    preparing a carrier sheet comprising a base film and an adhesive layer;
    forming a predetermined electrode pattern on said adhesive layer, said adhesive layer being separable from said electrode pattern by being cured with UV; and
    applying a ceramic slurry onto (A) said electrode pattern formed on said adhesive layer and (B) an exposed surface of said adhesive layer to form a ceramic binder layer which adheres to said electrode pattern and said exposed surface, thereby forming a flat ceramic green sheet on the carrier sheet.

2. The method according to claim 1, wherein an adhesive strength at ordinary temperature (23 degrees C.) to stainless steel of the adhesive layer separable by being cured with UV is more than 0.1 N/20 mm before UV irradiation and no more than 0.1 N/20 mm after UV irradiation.

3. A method for manufacturing a multilayer ceramic electronic component comprising steps of:
    manufacturing a ceramic green sheet by the method according to claim 1;
    laminating the ceramic green sheet onto other ceramic green sheets; and separating a carrier sheet from the ceramic green sheet by being irradiated with UV.

4. A multilayer ceramic electronic component obtained by the method according to claim 3.

5. A carrier sheet for ceramic green sheets used for the method according to claim 3, said carrier sheet comprising a base film and an adhesive layer separable by being cured with UV on one side of said base film.

6. A carrier sheet for ceramic green sheets used for the method according to claim 1, said carrier sheet comprising a base film and an adhesive layer separable by being cured with UV on one side of said base film.

7. The method according to claim 1, wherein an adhesive strength at ordinary temperature (23 degrees C.) to stainless steel of the adhesive layer separable by being cured with UV is more than 0.2 N/20 mm before UV irradiation and no more than 0.05 N/20 mm after UV irradiation.

8. The method according to claim 1, which additionally comprising separating the carrier sheet from the ceramic green sheet by being cured with UV.

9. A method for manufacturing a ceramic green sheet comprising steps of:
    preparing a carrier sheet comprising a base film and an adhesive layer;
    forming a predetermined electrode pattern on said adhesive layer, said adhesive layer being separable from said electrode pattern by heating; and applying a ceramic slurry onto (A) said electrode pattern formed on said adhesive layer and (B) an exposed surface of said adhesive layer to form a ceramic binder layer which adheres to said electrode pattern and said exposed surface, thereby forming a flat ceramic green sheet on the carrier sheet, wherein the adhesive layer separable by heating comprises thermal expandable fine particles.

10. The method according to claim 9, wherein a dynamic modulus of elastic of an adhesive forming the adhesive layer separable by heating is in a range of $5\times10^3$ to $1\times10^6$ Pa at a temperature of 23 degrees C. to 150 degrees C.

11. The method according to claim 9, wherein a dynamic modulus of elastic of an adhesive forming the adhesive layer separable by heating is in a range of $5\times10^4$ to $8\times10^5$ Pa at a temperature of 23 degrees C. to 150 degrees C.

12. The method according to claim 9, wherein the adhesive layer separable by heating foams when heated, and makes separation with ease.

13. The method according to claim 9, which additionally comprising separating the carrier sheet from the ceramic green sheet by heating.

14. A method for manufacturing a multilayer ceramic electronic component comprising steps of:

manufacturing a ceramic green sheet by the method according to claim 9;

laminating the ceramic green sheet onto other ceramic green sheets; and separating a carrier sheet from the ceramic green sheet by heating.

15. A carrier sheet for ceramic green sheets used for the method according to claim 9, said carrier sheet comprising a base film and an adhesive layer separable by heating on one side of said base film, wherein said adhesive layer comprises thermal expandable fine particles.

16. A method for manufacturing a ceramic green sheet comprising steps of: preparing a carrier sheet comprising a base film and an adhesive layer;

forming a predetermined electrode pattern on said adhesive layer, said adhesive layer being separable from said electrode pattern by heating; and applying a ceramic slurry onto (A) said electrode pattern formed on said adhesive layer and (B) an exposed surface of said adhesive layer to form a ceramic binder layer which adheres to said electrode pattern and said exposed surface, thereby forming a flat ceramic green sheet on the carrier sheet, wherein the adhesive layer separable by heating comprises a side chain crystalline. resin.

17. The method according to claim 16, wherein an adhesive strength to stainless steel of the adhesive layer separable by heating is more than 0.1 N/20 mm at ordinary temperature (23 degrees C.) and is no more than 0.1 N/20 mm when heated.

18. The method according to claim 16, wherein an adhesive strength to stainless steel of the adhesive layer separable by heating is more than 0.2 N/20 mm at ordinary temperature (23 degrees C.) and is no more than 0.05 N/20 mm when heated.

19. The method according to claim 16, which additionally comprising separating the carrier sheet from the ceramic green sheet by heating.

20. A method for manufacturing a multilayer ceramic electronic component comprising steps of:

manufacturing a ceramic green sheet by the method according to claim 16;

laminating the ceramic green sheet onto other ceramic green sheets; and separating a carrier sheet from the ceramic green sheet by heating.

21. A carrier sheet for ceramic green sheets used for the method according to claim 16, said carrier sheet comprising a base film and an adhesive layer separable by heating on one side of said base film, wherein said adhesive layer comprises a side chain crystalline resin.

* * * * *